United States Patent [19]
Feng et al.

[11] Patent Number: 5,268,866
[45] Date of Patent: Dec. 7, 1993

[54] MEMORY WITH COLUMN REDUNDANCY AND LOCALIZED COLUMN REDUDNANCY CONTROL SIGNALS

[75] Inventors: Tiasheng Feng; Stephen T. Flannagan; John D. Porter, all of Austin, Tex.

[73] Assignee: Motorola, Inc., Schaumburg, Ill.

[21] Appl. No.: 844,022

[22] Filed: Mar. 2, 1992

[51] Int. Cl.⁵ .............................................. G11C 7/00
[52] U.S. Cl. ............................... 365/200; 365/230.06; 365/225.7; 371/20.3
[58] Field of Search .............. 365/200, 230.03, 230.06, 365/225.7; 371/10.1, 10.3

[56] References Cited

U.S. PATENT DOCUMENTS 5,126,973  6/1992  Gallia et al. ......................... 365/200
5,134,584  7/1992  Boler et al. ......................... 365/200

Primary Examiner—Joseph A. Popek
Attorney, Agent, or Firm—Daniel D. Hill

[57] ABSTRACT

A memory (20) has a plurality of columns of memory cells and has a plurality of redundant columns of memory cells. A comparator (45) detects an access to a defective column. A redundant write generator (31) and write fuses (32) are provided for each write portion (30A, 30B, 30C, and 30D) to replace the defective column with a redundant column by replacing a write global data line (37) with a redundant write global data line (39). Redundant read generators (60 and 61) and read fuses (59) are provided for each read portion (50A, 50B, 50C, and 50D) to replace a defective column by deselecting a read global data line (29) and replacing it with a redundant read global data line (44). The fuses and redundant generators are located close to their global data lines, thus reducing the routing of control signals and improving the access time of redundant columns.

20 Claims, 6 Drawing Sheets

MEMORY WITH COLUMN REDUNDANCY AND LOCALIZED COLUMN REDUDNANCY CONTROL SIGNALS

FIELD OF THE INVENTION

This invention relates generally to integrated circuit memories, and more particularly, to integrated circuit memories which have column redundancy.

BACKGROUND OF THE INVENTION

An integrated circuit memory is generally implemented as an array of memory cells in a plurality of rows and columns. Memory cells are addressable through row and column decoders. Data is then written into, or read from, the addressed memory cells. Also, an integrated circuit memory may be subdivided into blocks of memory cells which are addressed by block decoding. A plurality of blocks may be grouped into arrays of blocks with a memory containing one or more arrays.

As the memory storage capacity of integrated circuit memories increases, the possibility of having manufacturing defects in the rows and columns increases. And this results in a decrease in production yields. One way to increase production yields in large integrated circuit memories is column and row redundancy. In an integrated circuit memory with redundancy, a manufacturing defect in a particular row can be cured by using a redundant row in place of the defective row. Likewise, a defect in a particular column can be cured by using a redundant column to replace the defective column. To implement column and row redundancy, redundant control logic and redundant read/write data paths are also required.

In order to repair a defective row or column, the defective row or column is deselected and a redundant row or column is assigned in its place by blowing a fusible link. The fusible link may be blown using a high-energy laser, or may be blown electrically at probe test. The ability to repair a memory that has only a few defective rows or columns can result in substantially increased manufacturing yields.

Some integrated circuit memories which use a technique known as the revolutionary pinout has input/output circuitry on both sides of the array of the memory cells allowing for shorter data paths and faster access times. Also, integrated circuit memories using the revolutionary pinout technique have power and ground pins on the sides of the package, whereas integrated circuit memories using the conventional pinout technique have power and ground pins on the corners. A problem that has arisen with redundancy in memories that use the revolutionary pinout is that the access time of the redundant memory array may be slower than the access time of the main memory. This is because the redundant read/write control logic is centralized, thus requiring global redundant control signals to travel longer distances to reach the separated input/output circuitry. This problem becomes worse as the number of memory cells on an integrated circuit memory becomes very large.

Another problem associated with redundancy is increased die width due to the redundant read/write control signals crossing the array area. In order for the die to fit into the standard SOJ/FLAT package, the die width must not exceed a maximum value. Thus the die width of larger memories may become a critical factor.

SUMMARY OF THE INVENTION

Accordingly, there is provided, in one form, a memory having column redundancy with improved access time of the redundant columns and that is easily configurable for words of different widths. The memory comprises a left array having a top and a bottom and a left array of redundant columns below the left array. There is a right array having a top and a bottom and a right array of redundant columns below the right array. A read global data line is coupled to the left array and to the right array and disposed therebetween, for reading data from the left and right arrays. A redundant read global data line is coupled to the left and right arrays of redundant columns and disposed therebetween, for reading data from the left array of redundant columns and the right array of redundant columns. A top read portion is coupled to the read global data line and to the redundant read global data line and disposed above the left and right arrays, for providing a first data signal conducted by either, the read global data line or the redundant read global data line, in response to a first fuse operation. A bottom read portion is coupled to the read global data line and to the redundant read global data line and disposed below the left and the right redundant arrays, for selectively coupling a second data signal from either, the read global data line or the redundant read global data line, in response to a second fuse operation.

DESCRIPTION OF THE PREFERRED EMBODIMENT

Figure 1:
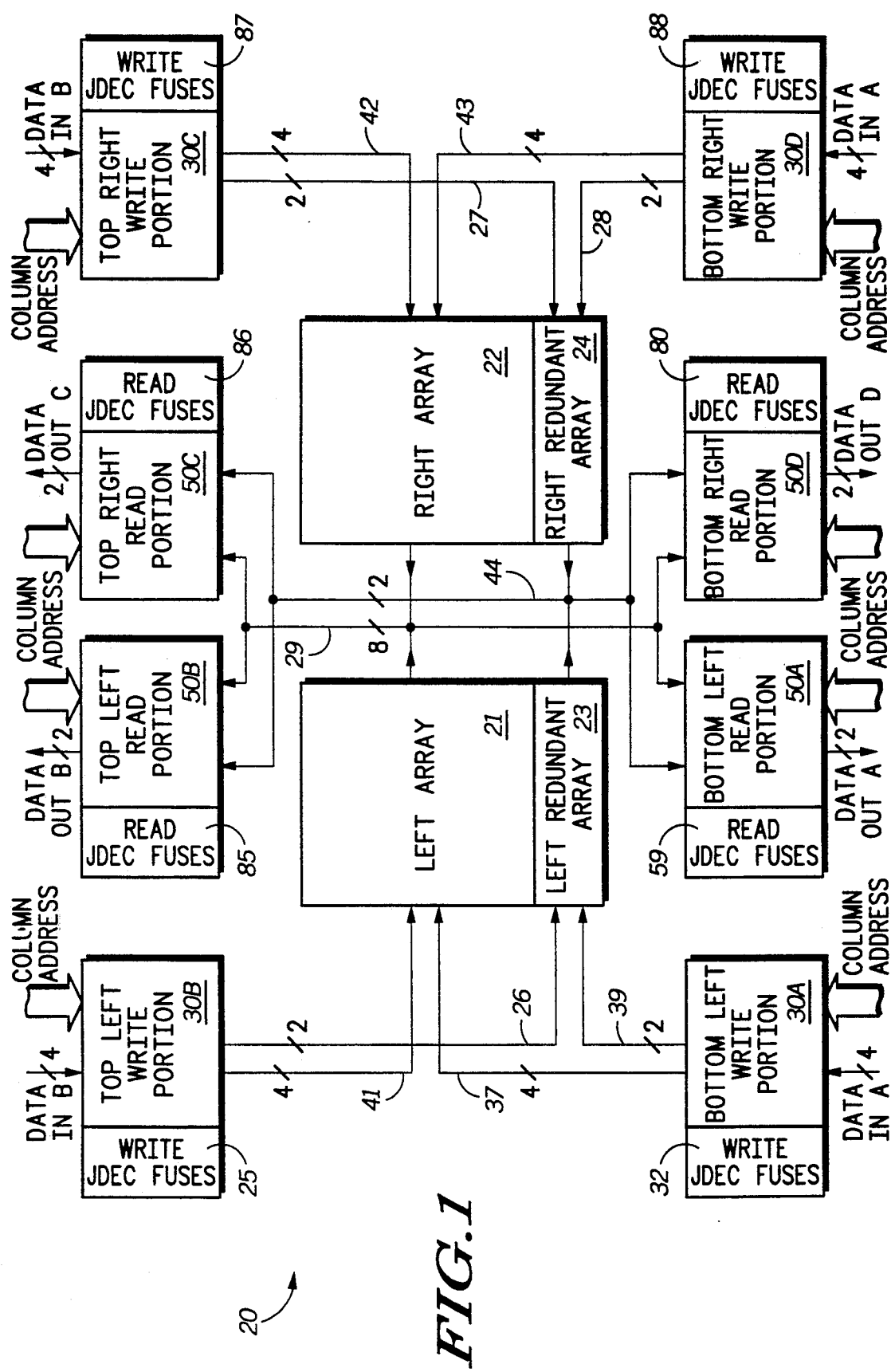
FIG. 1 shows a block diagram of a memory with column redundancy in accordance with one embodiment of the present invention.

FIG. 1 shows a block diagram of a memory 20 with column redundancy in accordance with one embodiment of the present invention. Some of the input/output circuitry and control signals have been omitted from FIG. 1 and will be illustrated later. Also, address buffers and predecoders are not shown. Memory 20 includes a left array of memory cells 21, a right array of memory cells 22, a left redundant array of memory cells 23 at the bottom of the left array 21, and a right redundant array of memory cells 24 at the bottom of right array 22. Memory 20 also includes a bottom left write portion 30A, a top left write portion 30B, a top right write portion 30C, a bottom right write portion 30D, a bottom left read portion 50A, a top left read portion 50B, a top right read portion 50C, and a bottom right read portion 50D. Finally, memory 20 has write JDEC fuses 32, 25, 87, and 88, and read JDEC fuses 59, 85, 86, and 80. Left array 21 and right array 22 are each divided into 16 sub-arrays or blocks.

Bottom left write portion 30A receives a plurality of predecoded column address signals labelled "COLUMN ADDRESS", and receives input data corresponding to external data provided as differential signal pairs labelled "DATA IN A". In response, write portion 30A provides four differential signal pairs to left array 21 via four write global data line pairs 37 and two differential signal pairs to left redundant array 23 via two redundant write global data line pairs 39. Top left write portion 30B receives COLUMN ADDRESS and input data provided as differential signal pairs corresponding to external data labelled "DATA IN B". In response, write portion 30B provides four differential signal pairs to left array 21 via four write global data line pairs 41 and two differential signal pairs to left redundant array 23 via two redundant write global data line pairs 26. Top right write portion 30C receives COLUMN ADDRESS and input data provided as differential signal pairs corresponding to external data labelled "DATA IN B". In response, write portion 30C provides four differential signal pairs to right array 22 via four write global data line pairs 42 and two differential signal pairs to right redundant array 24 via two redundant write global data line pairs 27. Bottom right write portion 30D receives COLUMN ADDRESS and input data provided as differential signal pairs corresponding to external data labelled "DATA IN A". In response, write portion 30D provides four differential signal pairs to right array 22 via four write global data line pairs 43 and to differential signal pairs to right redundant array 24 via two redundant write global data line pairs 28.

Bottom left read portion 50A receives COLUMN ADDRESS and receives two differential signal pairs corresponding to data from left array 21 or right array 22 via two of the read global data line pairs 29. Read portion 50A also receives data from left redundant array 23 and right redundant array 24 via redundant read global data line pairs 44. In response, read portion 50A provides two corresponding data signals labelled "DATA OUT A". Top left read portion 50B receives COLUMN ADDRESS and receives a two differential signal pairs corresponding to data from left array 21 or right array 22 via two of the read global data line pairs 29. Read portion 50B also receives data from left redundant array 23 and right redundant array 24 via redundant read global data line pairs 44. In response, read portion 50B provides two corresponding logic signals labelled "DATA OUT B". Top right read portion 50C receives COLUMN ADDRESS and receives two differential signal pairs corresponding to data from left array 21 or right array 22 via two of the read global data line pairs 29. Read portion 50C also receives data from left redundant array 23 and right redundant array 24 via redundant read global data line pairs 44. In response, read portion 50C provides two corresponding logic signals labelled "DATA OUT C". Bottom right read portion 50D receives COLUMN ADDRESS and receives four differential signal pairs corresponding to data from left array 21 or right array 22 via two of the read global data line pairs 29. Read portion 50D also receives data left redundant array 23 and right redundant array 24 via redundant read global data line pairs 44. In response, read portion 50D provides two corresponding logic signals labelled "DATA OUT D". Note that DATA IN A, DATA IN B, DATA OUT A, DATA OUT B, DATA OUT C, AND DATA OUT D connect to output buffers and bonding pads (not shown). The redundant read/write operation of memory 20 will be discussed below.

Memory 20 is configurable for a data organization, or word width of X1, X4, or X8, and has separate data paths for reading data from memory and for writing data into memory. Each write portion 30A, 30B, 30C, and 30D is capable of writing four bits of data into memory 20 during a single write cycle, also called write mode. However, only two of the write portions are selected during a single write cycle. Each read portion 50A, 50B, 50C, and 50D may read two bits of data from memory 20 during a single read cycle, or read mode. All four read portions may be selected to read data during a single read cycle. As an example, if the data organization of memory 20 is X8, write portions 30A and 30B may write data into left array 21 or write portions 30C and 30D may write data into right array 22 during a single write cycle, depending on which write portions are selected. All four read portions 50A, 50B, 50C, and 50D may be used to read data from left array 21 or from right array 22 during a single read cycle. If the data organization of memory 20 is X4, two write portions and all four read portions are used during a single write or read cycle as described for the X8 data organization, but only two bits of data are written into each of the selected write portions and only one bit is read from a read portion. If the data organization of memory 20 is X1, only one bit of data is received or provided at a time. Therefore, for a X1 data organization, only one write portion is required and only one read portion is required for a single write or read cycle. Note that FIG. 1 depicts the relative physical locations of write portions 30A, 30B, 30C, and 30D and read portions 50A, 50B, 50C, and 50D in relation to left array 21 and right array 22. Write global data line pairs 37 and 41 are routed down the left side of left array 21 and write global data line pairs 42 and 43 are routed down the right side of right array 22. Read global data line pairs 29 are routed between left array 21 and right array 22. Memory 20 uses the revolutionary pinout technique with this arrangement to reduce the length of the data paths and to improve access time.

If the data organization of memory 20 is X8, write portions 30A and 30D both receive four data signals DATA IN A corresponding to external data from the same four pins. Read portion 50A provides two data signals DATA OUT A and read portion 50D provides two data signals DATA OUT D, which can be provided to the same four pins as DATA IN A, or they can be provided to separate pins. The same is true for write portions 30B and 30C and read portions 50B and 50C. A X4 data organization would have the same data in/data out arrangement as the X8, except that half of the number of data signals are used. A X1 data organization has one pin for receiving external data and a separate pin for providing data.

Figure 2:
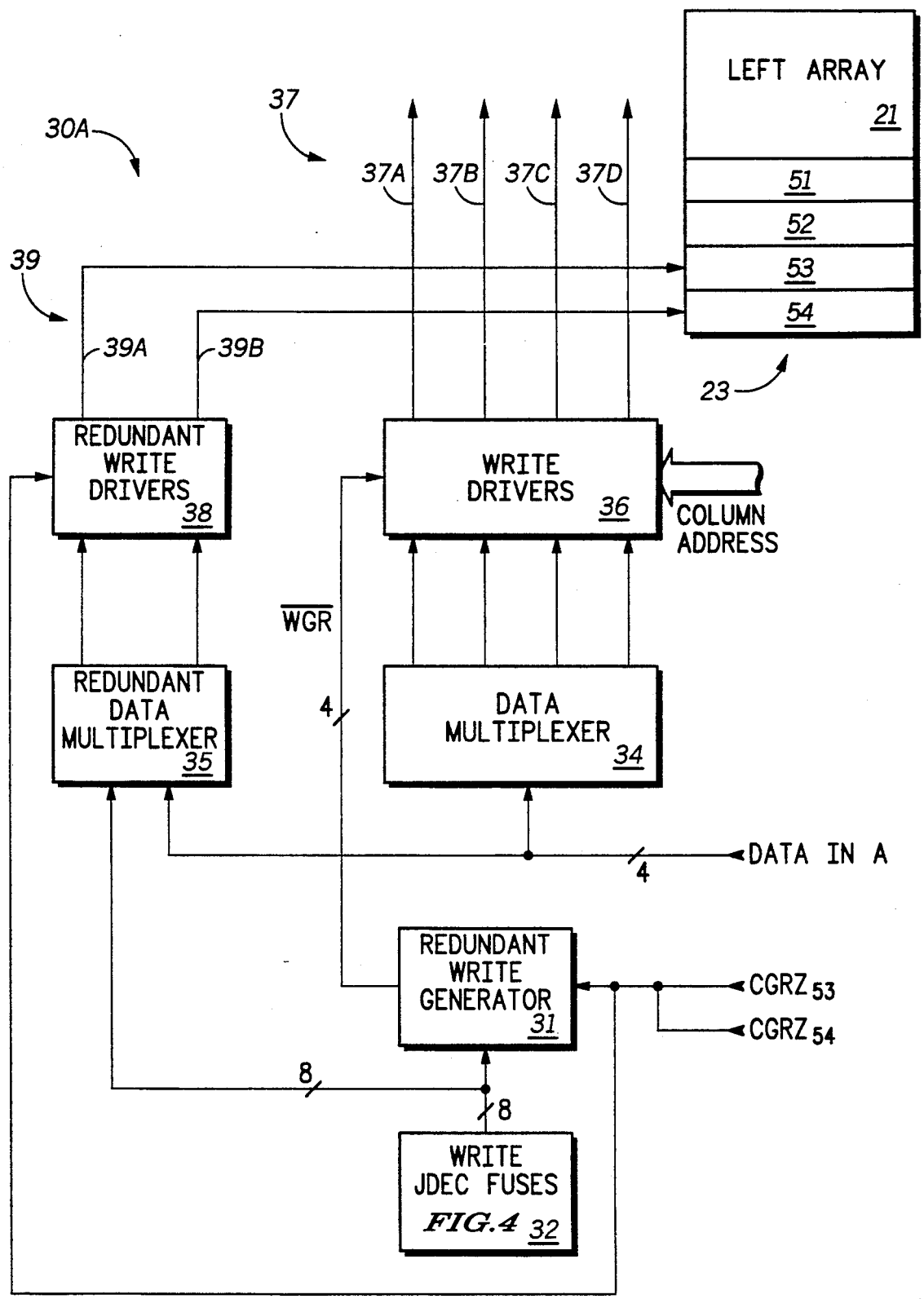
FIG. 2 depicts a block diagram of a portion of the redundant write path of the memory in FIG. 1.

FIG. 2 depicts a block diagram of bottom left write portion 30A of memory 20. The structure of top left write portion 30B, top right write portion 30C, and bottom right write portion 30D are identical to bottom left write portion 30A. Bottom left write portion 30A includes redundant write generator 31, data multiplexer 34, redundant data multiplexer 35, write drivers 36, redundant write drivers 38, write global data line pairs 37, and redundant write global data line pairs 39. Write global data line pairs 37 include write global data line pairs 37A, 37B, 37C, and 37D. Redundant write global data line pairs 39 include redundant write global data line pairs 39A and 39B. Write JDEC fuses 32 is connected to redundant data multiplexer 35 and redundant write generator 31. Each of the four write global data line pairs 37A, 37B, 37C, and 37D is connected to a plurality of columns in left array 21. Redundant write global data line pair 39A is connected to redundant column set 53 in left redundant array 23. Redundant write global data line pair 39B is connected to redundant column set 54 in left redundant array 23. Therefore, in the illustrated embodiment, only two sets of redundant columns 23 are connected to bottom left write portion 30A. Redundant column sets 51 and 52 are connected to top left write portion 30B via redundant global data line pairs 26. In other embodiments, a different number of sets of redundant columns can be included in redundant arrays 23 and 24.

Write drivers 36 receive column address signals COLUMN ADDRESS. Data multiplexer 34 and redundant data multiplexer 35 both receive DATA IN A. Redundant write generator 31 receives eight DC logic signals from write JDEC fuses 32 and receives control signals $CGRZ_{53}$ and $CGRZ_{54}$. Redundant write generator 31 provides a redundant write enable signal labelled "$\overline{WGR}$" to deselect a write driver of write drivers 36 when data is to be written into redundant column set 53 or 54. Write JDEC fuses 32 provides static, DC logic signals because they provide for more relaxed timing for control signals $CGRZ_{53}$ and $CGRZ_{54}$ during a write cycle.

Figure 3:
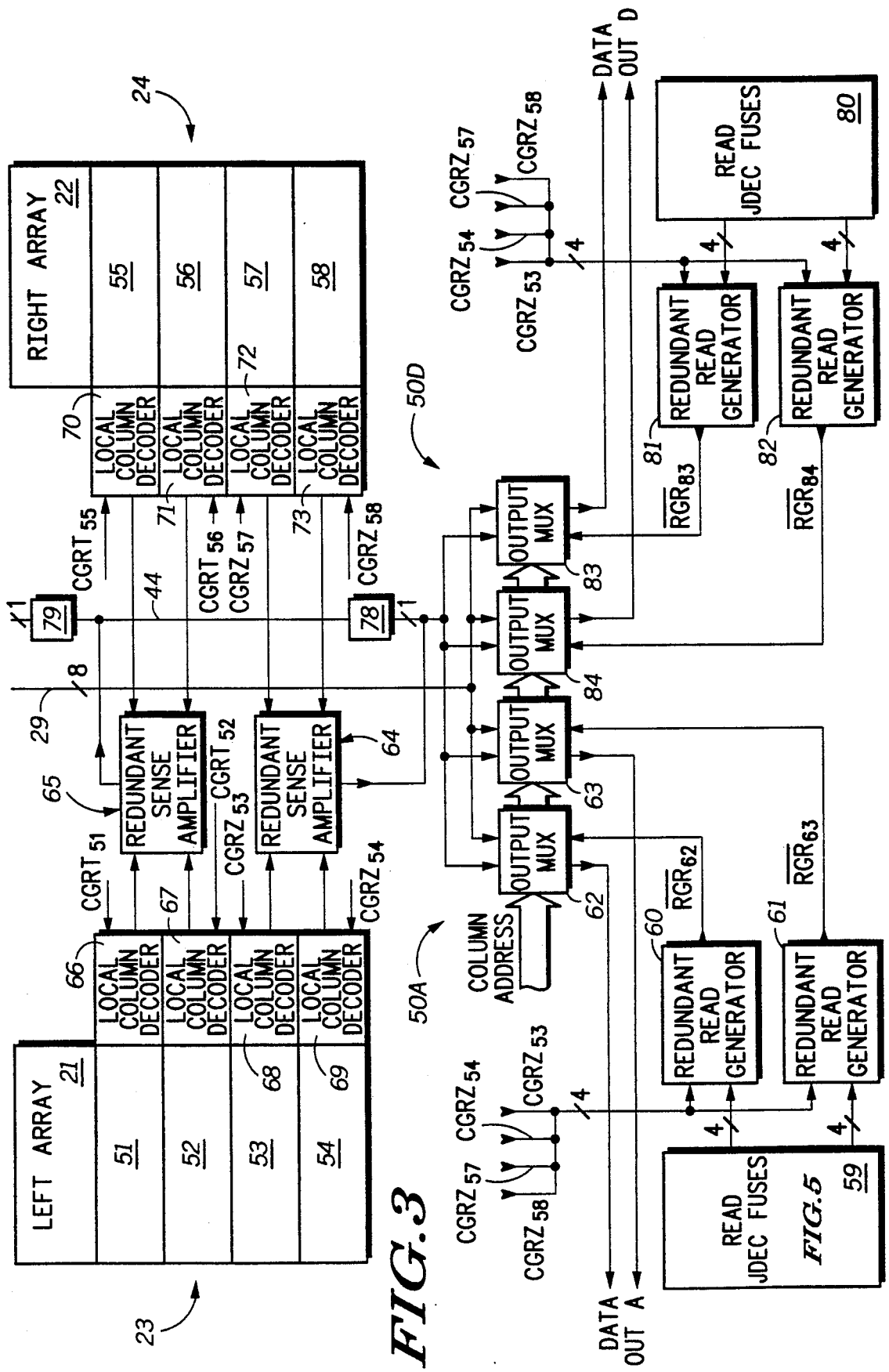
FIG. 3 depicts a block diagram of the bottom portions of the redundant read path of the memory in FIG. 1.

FIG. 3 depicts a block diagram of bottom left read portion 50A and bottom right read portion 50D of memory 20. The structures of read portions 50B and 50C are identical to read portions 50A and 50D. Bottom left read portion 50A includes redundant read generator 60, redundant read generator 61, output data multiplexer 62 labelled "OUTPUT MUX", and output data multiplexer 63 labelled "OUTPUT MUX". Bottom right read portion 50D includes redundant read generator 81, redundant read generator 82, output data multiplexer 83 labelled "OUTPUT MUX", and output data multiplexer 84 labelled "OUTPUT MUX". Redundant array 23 includes redundant column sets 51, 52, 53, and 54, as previously illustrated, and local column decoders 66, 67, 68, and 69. Redundant array 24 includes redundant column sets 55, 56, 57, and 58, and local column decoders 70, 71, 72, and 73. Read JDEC fuses 59 is connected to redundant read generators 60 and 61. Read JDEC fuses 80 is connected to redundant read generators 81 and 82. Read global data line pairs 29 connects read portions 50A, 50B, 50C, and 50D to both left array 21 and right array 22. Redundant read global data line pairs 44 includes connectors 78 and 79. Redundant read global data line pairs 44 connects left redundant array 23 and right redundant array 24 to read portions 50A, 50B, 50C, and 50D.

Each set of redundant columns 51–58 is arranged in groups of four contiguous columns. Any of the sets of redundant columns 51, 52, 53, or 54 in left redundant array 23 can replace four contiguous columns in left array 21. And any of the sets of redundant columns 55, 56, 57, or 58 in right redundant array 24 can replace four contiguous columns in right array 22. When any defective column is to be replaced, three other adjacent columns are replaced as well as the identified defective column. This results in four contiguous columns in left array 21 or right array 22 being replaced by four contiguous columns in redundant column array 23 or 24. In other embodiments, a set of redundant columns can include more or less than four contiguous columns.

Local column decoder 66 is connected between redundant column set 51 and redundant sense amplifier 65 and receives a control signal labelled "$CGRT_{51}$". Local column decoder 67 is coupled between redundant column set 52 and redundant sense amplifier 65 and receives control signal $CGRT_{52}$. Local column decoder 68 is coupled between redundant column set 53 and redundant sense amplifier 64 and receives control signal $CGRZ_{53}$. Local column decoder 69 is coupled between redundant column set 54 and redundant sense amplifier 64 and receives control signal $CGRZ_{54}$. Local column decoder 70 is coupled between redundant column set 55 and redundant sense amplifier 65 and receives control signal $CGRT_{55}$. Local column decoder 71 is coupled between redundant column set 56 and redundant sense amplifier 65 and receives control signal $CGRT_{56}$. Local column decoder 72 is coupled between redundant columns 57 and redundant sense amplifier 64 and receives control signal $CGRZ_{57}$. Local column decoder 73 is coupled between redundant column set 58 and redundant sense amplifier 64 and receives control signal $CGRZ_{58}$. Note that the letter "T" in the control signal name simply means that the control signal goes to the top read and write portions, and the letter "Z" simply means that the control signal goes to the bottom read and write portions. Memory 20 may be designed to include additional redundant sense amplifiers and sets of redundant columns.

Local column decoders 66–73 function to selectively couple a set of redundant columns 51–58 to redundant sense amplifier 64 or 65. Redundant sense amplifiers 64 and 65 couple data provided by a selected set of redundant columns to redundant read global data line pairs 44. Redundant read global data line pairs 44 carry data from redundant sense amplifiers 64 and 65 to data output multiplexers 62, 63, 83, and 84 of bottom read portions 50A and 50D, respectively. Data output multiplexers 62, 63, 83, and 84 receive data from both read global data line pairs 29 and redundant read global data line pairs 44. Data output multiplexers 62 and 63 provide DATA OUT A. Data output multiplexers 83 and 84 provide DATA OUT D. Redundant read generators 60 and 61 receive one of the control signals $CGRZ_{53}$, $CGRZ_{54}$, $CGRZ_{57}$, or $CGRZ_{58}$. Redundant read generators 60 and 61 also receive DC logic signals from read JDEC fuses 59 and provide enable signals labelled "$\overline{RGR_{62}}$" and "$\overline{RGR_{63}}$" to data output multiplexers 62 and 63, respectively. When enable signal $\overline{RGR_{62}}$ is received by data output multiplexer 62, data is read from one of redundant column sets 53, 54, 57, or 58 instead of from a defective column during a read cycle of memory 20. For example, to read data from redundant column set 53, local column decoder 68 receives control signal $CGRZ_{53}$. This causes data to be received by redundant sense amplifier 64, which then directs the data to redundant read global data line pairs 44. Redundant read generator 60 receives control signal $CGRZ_{53}$ and also DC logic signals from read JDEC fuses 59. As a result, enable signal $\overline{RGR_{62}}$ is provided to data output multiplexer 62 which causes data output multiplexer 62 to read data from redundant read global data line pairs 44 instead of from read global data line pairs 29.

Either connector 78 or 79 is installed during the manufacturing process when the last metal layer is deposited in order to configure the data organization of memory 20. Connector 79 is used to provide a connection between redundant sense amplifier 65 and read portions 50B and 50C when configuring memory 20 for a X8 or X4 data organization. Connector 78 is not installed for a X8 or X4 data organization in order to separate redundant sense amplifier 64 from read portions 50B and 50C. Read portions 50A and 50D will only read data from redundant column sets 53, 54, 57, and 58, and read portions 50B and 50C will only read from redundant column sets 51, 52, 55, and 56. If the desired data organization of memory 20 is X1, connector 78 is installed instead of connector 79 to allow a read portion 50A or 50D to read data from any of the redundant columns, since only one read portion is needed for a X1 data organization.

By separating the redundant read/write control logic into individual units and locating these units close to their respective read and write portions, the need to route redundant control signals across the integrated circuit memory is reduced. This allows for smaller transistor sizes and shorter propagation delays, thereby improving access time of the redundant columns and reducing the amount of surface area on the integrated circuit used for column redundancy.

Figure 4:
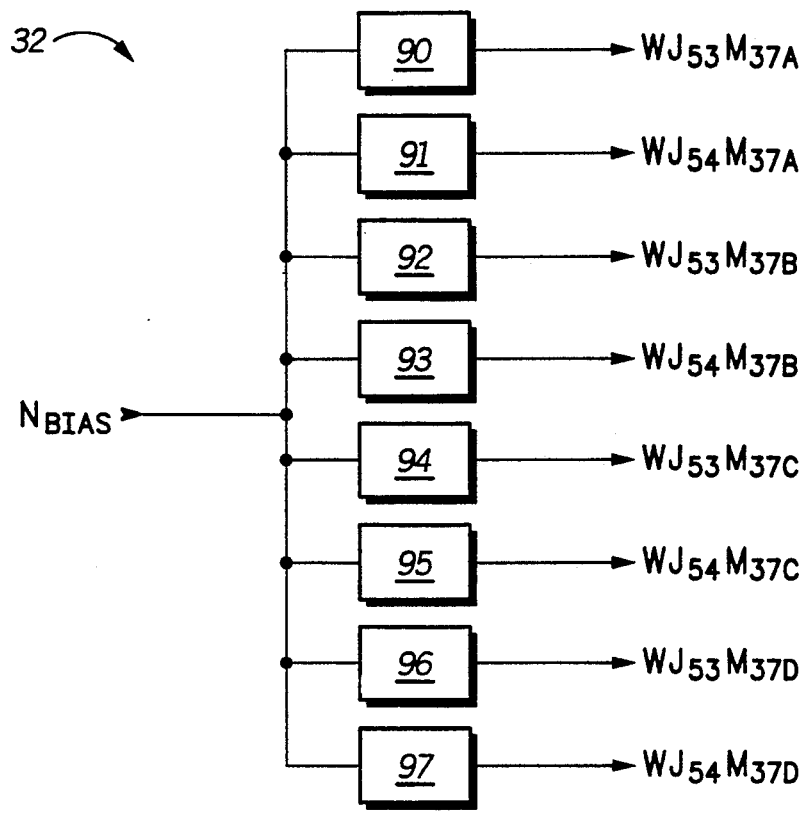
FIG. 4 illustrates a block diagram of the write fuses of the bottom left write portion of FIG. 2.

FIG. 4 illustrates a block diagram of write JDEC fuses 32 of bottom left write portion 30A of FIG. 2. Write JDEC fuses 32 includes eight fuse circuits 90, 91, 92, 93, 94, 95, 96, and 97. Fuse circuit 90 provides a DC logic signal labelled "$WJ_{53}M_{37A}$". Fuse circuit 91 provides a DC logic signal labelled "$WJ_{54}M_{37A}$". Fuse circuit 92 provides a DC logic signal labelled "$WJ_{53}M_{37B}$". Fuse circuit 93 provides a DC logic signal labelled "$WJ_{54}M_{37B}$". Fuse circuit 94 provides a DC logic signal labelled "$WJ_{53}M_{37C}$". Fuse circuit 95 provides a DC logic signal labelled "$WJ_{54}M_{37C}$". Fuse circuit 96 provides a DC logic signal labelled "$WJ_{53}M_{37D}$". Fuse circuit 97 provides a DC logic signal labelled "$WJ_{54}M_{37D}$". Redundant write generator 31, and redundant data multiplexer 35 (shown in FIG. 2) each receive all eight of these DC logic signals from write JDEC fuses 32.

Each fuse circuit 90-97 has a fusible link that can be blown with a laser. As an example, if the fusible link of fuse circuit 90 is blown, then $WJ_{53}M_{37A}$ will be a logic high DC signal. If the fusible link of fuse circuit 90 is not blown, then $WJ_{53}M_{37A}$ will be a logic low. Write JDEC fuses 32 can therefore be used to permanently store which redundant column is to replace a defective column. Each fuse circuit of write JDEC fuses 32 is used to assign a particular redundant column to a particular set of write global data line pairs. In the embodiment shown in FIG. 2, write JDEC fuses 32 are used to link redundant column sets 53 and 54 to write global data line pairs 37A, 37B, 37C, and 37D.

Referring now to both FIG. 2 and FIG. 4, if redundant write generator 31 receives both control signal $CGRZ_{53}$ and a logic high DC signal $WJ_{53}M_{37A}$ from write JDEC fuses 32, redundant write generator 31 will provide enable signal $\overline{WGR}$ to a write driver of write drivers 36 indicating that the addressed column from left array 21 is defective. Control signal $CGRZ_{53}$ is also received by redundant write drivers 38 and data intended for a defective column on write global data line pair 37A would instead be written on redundant column set 53 via redundant global data line 39A. Likewise, if there is a defective column in left array 21 that is coupled to write global data line 37B, redundant column set 54 may be substituted for the defective column and adjacent columns by blowing the fusible link in fuse circuit 93 to cause DC signal $WJ_{54}M_{37B}$ to be a logic high. Write JDEC fuses are used to write data into redundant column sets and read JDEC fuses are used to retrieve data from redundant column sets. Since there are two redundant column sets 53 and 54 associated with bottom left write portion 30A, and four write global data line pairs 37A-37D, eight fuse circuits are required in write JDEC fuses 32 to include all of the possible combinations of redundant write global data line pairs 39 with write global data line pairs 37.

Figure 5:
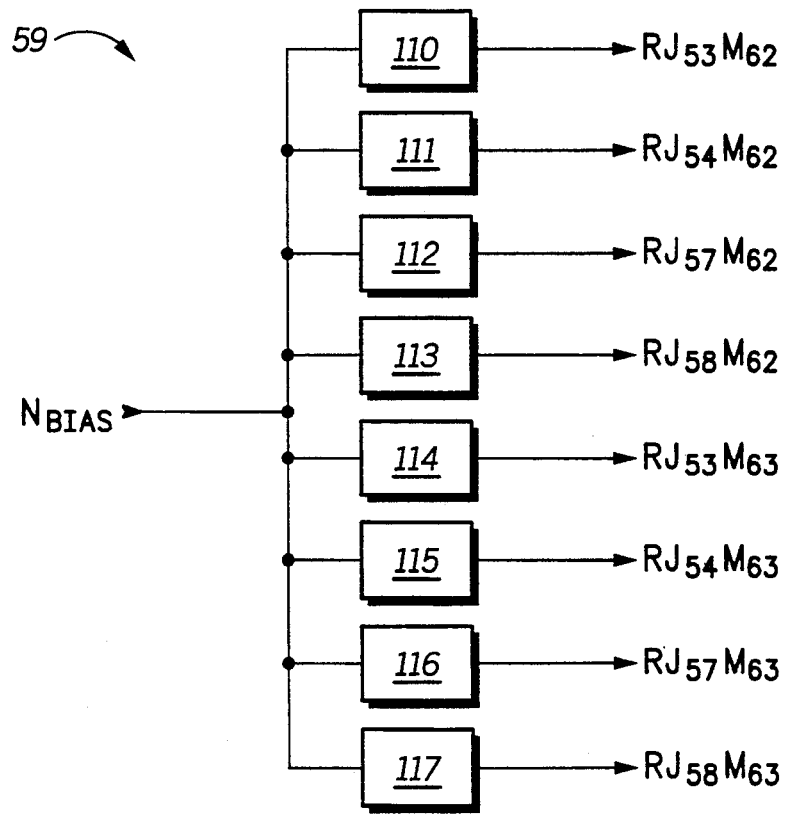
FIG. 5 illustrates a block diagram of the read fuses of the bottom left read portion of FIG. 3.

FIG. 5 illustrates a block diagram of read JDEC fuses 59 of bottom left read portion 50A. Read JDEC fuses 59 includes eight fuse circuits 110, 111, 112, 113, 114, 115, 116, and 117. Read JDEC fuses 59 provides eight DC signals to redundant read generator 60 and 61. Fuse circuit 110 provides a DC logic signal labelled "$RJ_{53}M_{62}$". Fuse circuit 111 provides a DC logic signal labelled "$RJ_{54}M_{62}$". Fuse circuit 112 provides a DC logic signal labelled "$RJ_{57}M_{62}$". Fuse circuit 113 provides a DC logic signal labelled "$RJ_{58}M_{62}$". Fuse circuit 114 provides a DC logic signal labelled "$RJ_{53}M_{63}$". Fuse circuit 115 provides a DC logic signal labelled "$RJ_{54}M_{63}$". Fuse circuit 116 provides a DC logic signal labelled "$RJ_{57}M_{63}$". Fuse circuit 117 provides a DC logic signal labelled "$RJ_{58}M_{63}$".

DC logic signals from fuse circuits 110, 111, 112, and 113 are received by redundant read generator 60 and DC logic signals from fuse circuits 114, 115, 116, and 117 are received by redundant read generator 61. Each fuse circuit 110-117 has a fusible link that can be blown with a high energy laser. Read JDEC fuses 59 function in the same way as write JDEC fuses 32. If the fusible link of fuse circuit 110 is blown, then DC signal $RJ_{53}M_{62}$ will be provided as a logic high. If the fusible link of fuse circuit 110 is not blown, then DC signal $RJ_{53}M_{62}$ will be a logic low. Read JDEC fuses 59 can therefore be used to permanently store information as to which redundant column is to replace a defective column during a read cycle. For example, in the embodiment shown in FIG. 3, read JDEC fuses 59 are used to link a redundant column set 53, 54, 57, or 58 to either of data output multiplexers 62 or 63.

Referring now to both FIG. 3 and FIG. 5, if while memory 20 is in read mode, redundant read generator 60 receives a logic high DC signal $RJ_{53}M_{62}$ from read JDEC fuses 59, and also receives control signal $CGRZ_{53}$, then enable signal $\overline{RGR_{62}}$ will be provided by redundant read generator 60 to output multiplexer 62, preventing output multiplexer 62 from receiving data from read global data line pairs 29. At the same time, control signal $CGRZ_{53}$ is also received by local column decoder 68 allowing data to be received by redundant sense amplifier 64 from redundant column set 53. Output multiplexer 62 then receives the data from redundant read global data line pairs 44.

If a read portion is not used because of the particular data organization, then the read JDEC fuses that are associated with those portions are not used. For example, if the word width is X8, then all fuse circuits of the read JDEC fuses are used because all of the read portions are used. But if the word width is X4, only half of each read portion is used. All write JDEC fuses may be used independent of the data organization. This feature makes the column redundancy easily configurable for different word widths during fabrication of memory 20.

Figure 6:
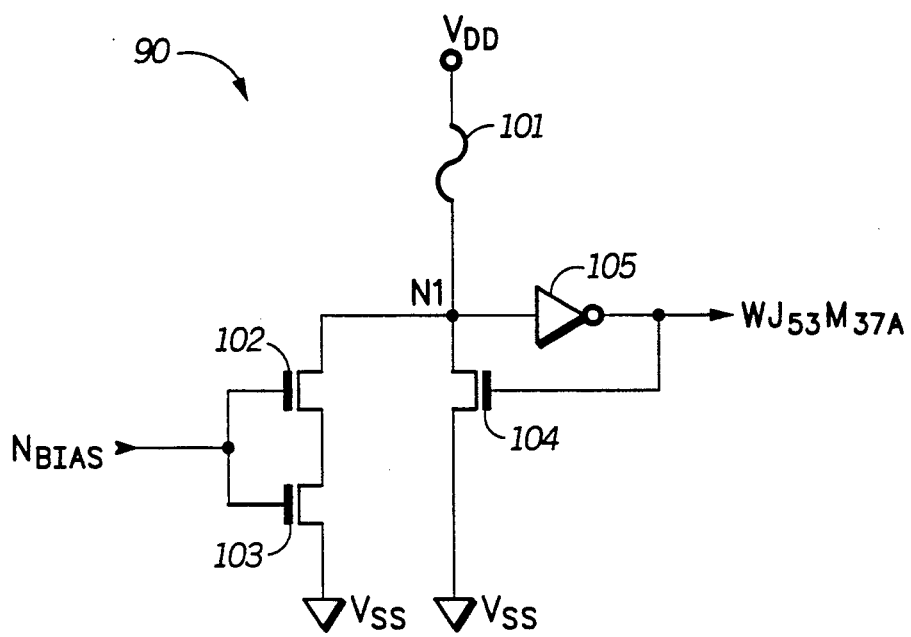
FIG. 6 illustrates in partial schematic form and partial logic diagram form a write fuse circuit of the write fuses of FIG. 4.

FIG. 6 illustrates in partial schematic form and partial logic diagram form a fuse circuit 90 of write JDEC fuses 32. Fuse circuits 110-117 of read JDEC fuses 59 are identical to fuse circuit 90. Fuse circuit 90 includes fusible link 101, N-channel transistors 102, 103, and 104, and inverter 105. Fusible link 101 has a first terminal coupled to a first power supply voltage terminal labelled "$V_{DD}$" and a second terminal connected to a node labelled "N1". Transistor 102 has a first current electrode coupled to the second terminal of fusible link 101, a second current electrode connected to N1, and a control electrode for receiving a control signal labelled "$N_{BIAS}$". Transistor 103 has a first current electrode coupled to the second current electrode of transistor 102, a second current electrode coupled to a second power supply voltage terminal labelled "$V_{SS}$", and a control electrode coupled to the control electrode of transistor 102 and for receiving $N_{BIAS}$. Transistor 104 has a first current electrode coupled to the second terminal of fusible link 101 at node N1, a second terminal coupled to $V_{SS}$, and a control electrode. Inverter 105 has a first terminal coupled to the second terminal of fusible link 101 at node N1 and a second terminal coupled to the control electrode of transistor 104 and providing DC signal $WJ_{53}M_{37A}$. In the present embodiment, $V_{DD}$ is approximately 5.0 volts above $V_{SS}$ and $N_{BIAS}$ is approximately 2.0 volts above $V_{SS}$.

Before fusible link 101 is blown, a current path exists between $V_{DD}$ and node N1. Transistors 102 and 103 are both driven into saturation by $N_{BIAS}$, thereby providing constant current sources which cause a constant DC current to flow through fusible link 101 and transistors 102 and 103. Transistors 102 and 103 are sized very small and are much more resistive then fusible link 101, causing the voltage at node N1 to be substantially $V_{DD}$. Since N1 is being held at a logic high, DC signal $WJ_{53}M_{37A}$ is at a logic low. N-channel transistor 104 is nonconductive because the voltage at the control electrode of transistor 104 is a logic low. When fusible link 101 is blown, the current path through fusible link 101 and transistors 102 and 103 is broken. Transistors 102 and 103 pull the voltage at N1 down to substantially $V_{SS}$, and inverter 105 causes $WJ_{53}M_{37A}$ to become a logic high. Transistor 104 becomes conductive and is sized to be a strong pulldown, thereby latching inverter 105 at a logic high and insuring that DC signal $WJ_{53}M_{37A}$ stays at a logic high. In another embodiment, fuse circuit 90 can be changed by replacing series transistors 102 and 103 with a single transistor to serve as the constant current source.

Figure 7:
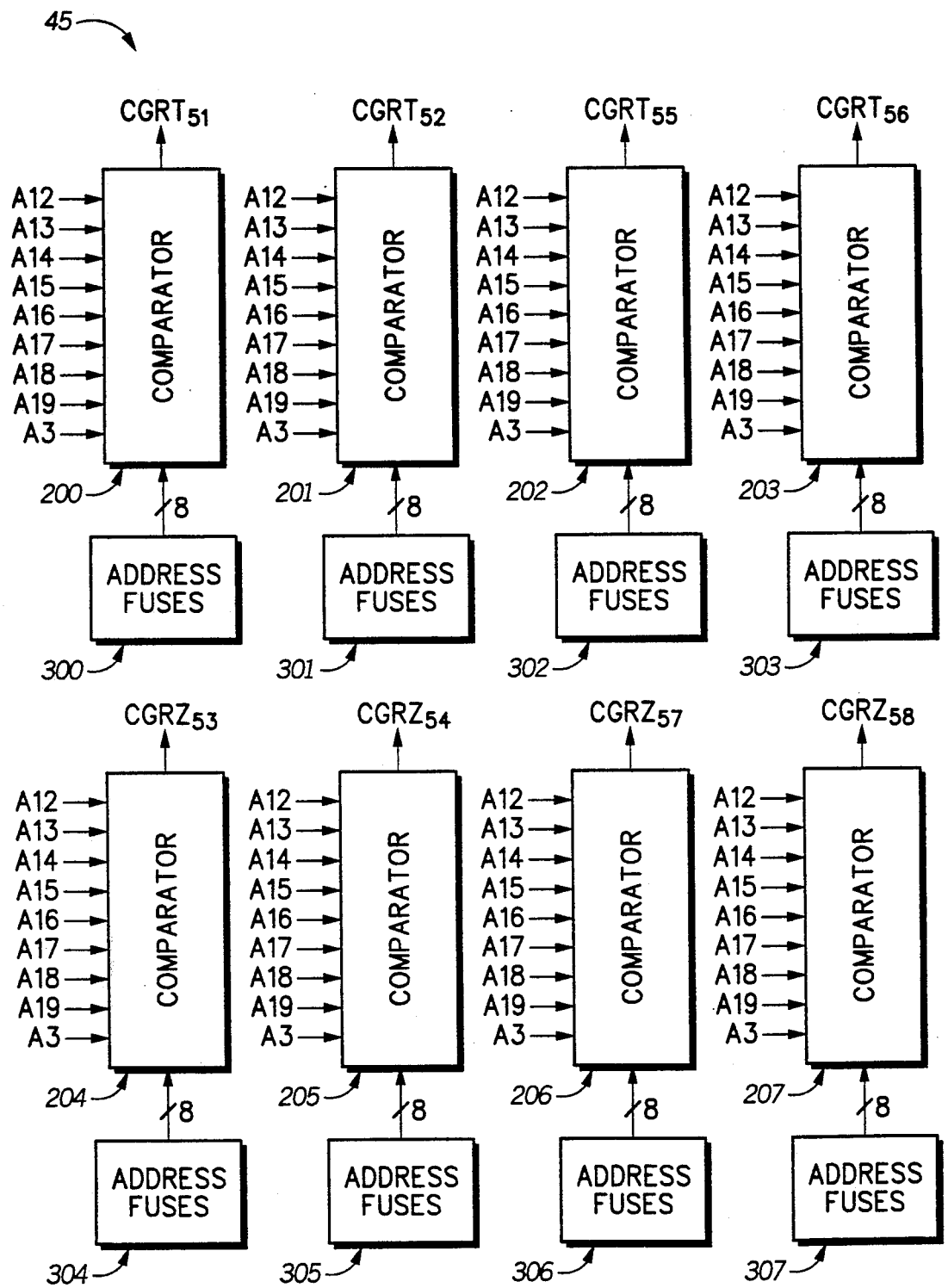
FIG. 7 shows a block diagram of a programmable comparator block.

Shown in FIG. 7 is a block diagram of programmable comparator block 45. Programmable comparator block 45 includes comparators 200, 201, 202, 203, 204, 205, 206, and 207, and address fuses 300, 301, 302, 303, 304, 305, 306, and 307. If memory 20 has a data organization of X1, comparator 200 is coupled to address fuses 300, receives column address signals A12, A13, A14, A15, A16, A17, A18, A19, and A3, and provides control signal $CGRT_{51}$. Comparator 201 is coupled to address fuses 301, receives address signals A12, A13, A14, A15, A16, A17, A18, A19, and A3, and provides control signal $CGRT_{52}$. Comparator 202 is coupled to address fuses 302, receives address signals A12, A13, A14, A15, A16, A17, A18, A19, and A3, and provides control signal $CGRT_{55}$. Comparator 203 is coupled to address fuses 303, receives address signals A12, A13, A14, A15, A16, A17, A18, A19, and A3, and provides control signal $CGRT_{56}$. Comparator 204 is coupled to address fuses 304, receives address signals A12, A13, A14, A15, A16, A17, A18, A19, and A3, and provides control signal $CGRZ_{53}$. Comparator 205 is coupled to address fuses 305, receives address signals A12, A13, A14, A15, A16, A17, A18, A19, and A3, and provides control signal $CGRZ_{54}$. Comparator 206 is coupled to address fuses 306, receives address signals A12, A13, A14, A15, A16, A17, A18, A19, and A3, and provides control signal $CGRZ_{57}$. Comparator 207 is coupled to address fuses 307, receives address signals A12, A13, A14, A15, A16, A17, A18, A19, and A3, and provides control signal $CGRZ_{58}$. The particular address signals received by programmable comparator block 45 have no special significance and may be different in other embodiments. Also, for data organizations of X4 or X8, fewer address signals will be required.

There is a comparator 200-207 for each redundant column set 51-58. Because there are eight redundant column sets in the illustrated embodiment, there are likewise eight comparators and eight address fuses. Each of address fuses 300-307 has a plurality of fuses for permanently storing the column address of a defective column. A validity fuse is also provided for each of address fuses 300-307. When a defective column is found during the manufacturing process of memory 20, and the defective column is determined to be repairable by replacing it with a redundant column set, the address of the defective column is stored by blowing the proper fusible links of one of address fuses 300-307. The validity fuse is also blown to indicate that the address of a defective column has been stored. The comparator then compares the incoming column address signals it receives to the address that is stored in the address fuse, and provides a control signal when the address signal matches the address stored in the address fuse. As an example, if the address of a defective column is stored by address fuse 304, the comparator 204 will compare the external addresses it receives to the stored address in address fuse 304. When the addresses match, comparator 204 provides control signal $CGRZ_{53}$ to redundant write generator 31 and redundant write driver 38 during a write cycle, and to redundant read generator 60, 61, 81, and 82 during a read cycle.

Referring again to FIG. 2, in a write mode of memory 20, DATA IN A is received by data multiplexer 34 of bottom left write portion 30A, COLUMN ADDRESS is received by write drivers 36. COLUMN ADDRESS selects which of write drivers 36 is to be driven to a state representative of the logic state of signal DATA IN A. Write global data line pairs 37 then carries the data to the selected address in left array 21 where it is written into memory cells. If a defective column in left array 21 has been replaced, comparator 204 of FIG. 7 will have address fuses 304 blown to correspond to the address of the defective column. The validity fuse of address fuses 304 will also be blown. If the defective column is one that is coupled to write global data line pairs 37A, and has been replaced by a redundant column set 53 from left redundant array 23, fuse circuit 90 of write JDEC fuses 32 will be blown. Fuse circuit 90 of write JDEC fuses 32 (FIG. 4) provides DC signal $WJ_{53}M_{37A}$ to redundant write generator 31 and to redundant data multiplexer 35. DC signal $WJ_{53}M_{37A}$ is used to identify which redundant column set 53 of redundant columns 23 is to replace the defective column in left array 21 that is coupled to write global data line pairs 37A. Programmable comparator 204 provides an control signal $CGRZ_{53}$ to redundant write generator 31 and to redundant write drivers 38. Redundant write generator 31 provides enable signal $\overline{WGR}$ to disable a write driver of write drivers 36 to prevent data corresponding to DATA IN A from being written onto the defective column. Redundant write drivers 38 are enabled by control signal $CGRZ_{53}$ to allow DATA IN A to be written onto redundant column set 53 via redundant write global data line pairs 39A.

Referring again to FIG. 3, in a read mode of memory 20, data is provided from left array 21 via read global data line pairs 29 to data output multiplexer 62, 63, 83, or 84. If a defective column in left array 21 has been replaced by redundant column set 53 from left redundant array 23, programmable comparator 204 provides a control signal $CGRZ_{53}$ to redundant read generators 60 and 61 and local column decoder 68. Fuse circuit 110 of read JDEC fuses 59 provides logic high DC signal $RJ_{53}M_{62}$ to redundant read generator 60. When control signal $CGRZ_{53}$ is received by redundant read generator 60 during a read cycle, enable signal $\overline{RGR}_{62}$ is provided to output multiplexer 62. Receiving enable signal $\overline{RGR}_{62}$ causes output multiplexer 62 to receive data from redundant read global data line pairs 44 instead of from read global data line pairs 29. Control signal $CGRZ_{53}$ is also provided to local column decoder 68 which causes redundant column set 53 to provide data to redundant sense amplifier 64. Redundant sense amplifier 64 provides corresponding data to redundant read global data line pairs 44. The data is provided to all of data output multiplexers 62, 63, 83, and 84. But only data output multiplexer 60, which received enable signal $\overline{RGR}_{62}$, will provide a DATA OUT A which corresponds to data on redundant read global data line pairs 44.

While the invention has been described in the context of a preferred embodiment, it will be apparent to those skilled in the art that the present invention may be modified in numerous ways and may assume many embodiments other than that specifically set out and described above. For example, there can be a different number of sets of redundant columns, and the sets of redundant columns can be located somewhere other than the bottom of the arrays of memory cells. Also, there can be a different number of contiguous columns in a set of redundant columns. Additionally, another type of nonvolatile memory can be used in place of read and write fuses to store information as to which redundant column set is to replace a defective column. In addition, data organizations different from X1, X4, or X8 may be used. Accordingly, it is intended by the appended claims to cover all modifications of the invention which fall within the true spirit and scope of the invention.

We claim:

1. A memory comprising:
   a left array having a top and a bottom;
   a left array of redundant columns below said bottom of said left array;
   a right array having a top and a bottom;
   a right array of redundant columns below said bottom of said right array;
   a read global data line coupled to said left array and to said right array and disposed therebetween, for reading data from said left and right arrays;
   a redundant read global data line coupled to said left and right arrays of redundant columns and disposed therebetween, for reading data from said left array of redundant columns and said right array of redundant columns;
   top read means, coupled to said read global data line and to said redundant read global data line and disposed above said top of said left and right arrays, for receiving a first fuse signal, and in response, selectively coupling a first data signal, from one of said read global data line and said redundant read global data line; and
   bottom read means, coupled to said read global data line and to said redundant read global data line and disposed below said bottom of said left and said right redundant arrays, for receiving a second fuse signal, and in response, selectively coupling a second data signal from one of said read global data line and said redundant read global data line.

2. The memory of claim 1, further comprising a second read global data line coupled to said left and right arrays and disposed therebetween and substantially parallel to said read global data line, for conducting signals complementary to said read global data line.

3. A memory comprising:
   a left array having a top and a bottom;
   a left array of redundant columns below said bottom of said left array;
   a right array having a top and a bottom;
   a right array of redundant columns below said bottom of said right array;
   a left write global data line disposed left of and coupled to said left array;
   a right write global data disposed right of and coupled to said right array;
   a left redundant write global data line disposed left of and coupled to said left array of redundant columns;
   a right redundant write global data line disposed right of coupled to said right array of redundant columns;
   left write means for receiving a first fuse signal and in response, selectively coupling a first data input signal to one of said left write global data line and said left redundant write global data line; and
   right write means for receiving a second fuse signal and in response, selectively coupling a second data input signal to one of said right global data line and said right redundant global data line.

4. The memory of claim 3, wherein said left write means comprises a top left write means and a bottom left write means, and said right write means comprises a top right write means and a bottom right write means.

5. The memory of claim 3, further comprising:
   a read global data line coupled to said left array and to said right array and disposed therebetween, for reading data from said left and right arrays;
   a redundant read global data line coupled to said left and right arrays of redundant columns and disposed therebetween, for reading data from said left array of redundant columns and said right array of redundant columns;
   top read means coupled to said read global data line and to said redundant read global data line and disposed above said top of said left and right arrays, for receiving a third fuse signal and in response, selectively coupling a first data signal conducted by one of said read global data line and said redundant read global data line; and
   bottom read means coupled to said read global data line and to said redundant read global data line and disposed below said bottom of said left and said right redundant arrays, for receiving a fourth fuse signal and in response, selectively coupling a second data signal from one of said read global data line and said redundant read global data line.

6. A memory comprising:

an array of memory elements organized in rows and columns;

a redundant array of redundant columns;

pluralities of read and write global data lines coupled to said array;

pluralities of redundant read and write global data lines coupled to said redundant array;

an address comparator including address fuse means for providing a plurality of defective address signals in response to an input address and a corresponding plurality of fuse signals;

write means, coupled to, for selectively coupling an input data signal to a selected one of said redundant write global data lines in response to said defective address signals during a write cycle; and read means coupled to for selectively coupling an output data signal to a selected one of said redundant read global data lines in response to said defective address signals during a read cycle.

7. A memory having a read mode and a write mode, comprising:

a plurality of arrays, each comprising a plurality of intersecting rows and columns of memory cells;

a plurality of sets of write global data line pairs, each set coupled to a corresponding array for carrying data to selected columns of said corresponding array;

a plurality of sets of read global data line pairs, each set coupled to an array, for carrying data from selected columns of said array;

a plurality of redundant columns of memory cells;

a plurality of sets of redundant write global data line pairs, each coupled to a corresponding redundant column, for carrying data to said redundant columns;

a plurality of sets of redundant read global data line pairs, each coupled to said redundant columns for carrying data from said redundant columns;

comparator means for detecting when a defective column in one of said arrays is to be replaced by a redundant column;

a plurality of write fuse means for selecting one of said redundant columns to replace a defective column when the memory is in the write mode;

a plurality of write means, each coupled to a corresponding one of said sets of write global data line pairs, a corresponding one of said sets of redundant write global data line pairs, a corresponding one of said write fuse means, and to said comparator means for selectively writing data onto one of said write global data line pairs, and said redundant write global data line pairs in response to said comparator means detecting a defective column when the memory is in the write mode;

a plurality of read fuse means for selecting which redundant column is to replace a defective column when the memory is in the read mode; and a plurality of read means, each coupled to a corresponding one of said sets of read global data line pairs, a corresponding one of said sets of redundant read global data line pairs, a corresponding one of said read fuse means, and to said comparator means for selectively reading data from one of said read global data line pairs and said redundant read global data line pairs in response to said comparator means detecting a defective column when the memory is in the read mode.

8. The memory of claim 7, wherein each redundant column is a set of four contiguous redundant columns.

9. The memory of claim 7, wherein said plurality of arrays comprises a first array and a second array, and wherein said plurality of redundant columns comprises a first plurality of redundant columns located at a bottom of said first array and a second plurality of redundant columns located at a bottom of said second array.

10. The memory of claim 9, wherein said first plurality of redundant columns is for replacing defective columns in said first array and said second plurality of redundant columns is for replacing defective columns in said second array.

11. The memory of claim 7, wherein each of said write fuse means provides a DC logic signal to write means corresponding thereto when a fusible link in said write fuse means is blown to indicate which redundant column is to replace a defective column.

12. The memory of claim 11, further comprising a plurality of redundant write generators, each coupled to a corresponding write means and to said comparator means, for receiving said DC logic signal and providing a control signal to deselect a defective column to prevent data from being written on the defective column when the memory is in write mode.

13. The memory of claim 7, wherein each read fuse means provides a DC logic signal to a read means corresponding thereto when a fusible link in said read fuse means is blown to indicate which redundant column is to replace a defective column.

14. The memory of claim 13, further comprising a plurality of redundant read generators, each coupled to a read means and to said comparator means, for receiving said DC logic signal and for deselecting a defective column to prevent data from being read from the defective column when the memory is in read mode.

15. A memory having a read mode and a write mode comprising:

a left and a right array of memory cells each comprising a plurality of blocks of intersecting rows and columns of memory cells;

said left array having a top portion and a bottom portion and said right array having a top portion and a bottom portion;

four sets of write global data line pairs, each set of write global data line pairs coupled to corresponding ones of top and bottom portions of said left and right arrays for carrying data to selected columns of said portions of said array;

four sets of read global data line pairs, each set of read global data line pairs coupled to corresponding ones of top and bottom portions of said left and right arrays for carrying data from selected columns of said portion of said array;

a left plurality of sets of redundant columns of memory cells located at the bottom of said left array, for replacing defective columns in said left array;

a right plurality of sets of redundant columns of memory cells located at the bottom of said right array, for replacing defective columns in said right array;

a plurality of sets of redundant write global data line pairs, each coupled to a corresponding redundant column for carrying data to said redundant column;

a plurality of redundant read global data line pairs, each coupled to a corresponding redundant column for carrying data from said redundant column;

comparator means for detecting when a defective column in said left or right array is to be replaced by a redundant column;

a plurality of write fuses for selecting one of said redundant columns to replace a defective column when the memory is in the write mode;

a plurality of write means, each coupled to a corresponding one of said sets of write global data line pairs, a corresponding one of said sets of redundant write global data line pairs, a corresponding one of said write fuses, and to said comparator means, for writing data onto one of said write global data line pairs, and said redundant write global data line pairs in response to said comparator means detecting a defective column when the memory is in the write mode;

a plurality of read fuses for selecting which of said redundant columns is to replace a defective column when the memory is in the read mode; and a plurality of read means, each coupled to a corresponding one of said sets of read global data line pairs, a corresponding one of said redundant read global data line pairs, a corresponding one of said read fuses and to said comparator means for reading data from one of said read global data line pairs, and said redundant read global data line pairs in response to said comparator means detecting a defective column when the memory is in the read mode.

16. The memory of claim 15 wherein each set of redundant columns comprises four contiguous redundant columns.

17. The memory of claim 15, wherein each write fuse provides a DC logic signal to a write means corresponding thereto when a fusible link in said write fuse is blown to indicate which redundant column is to replace a defective column.

18. The memory of claim 17, further comprising a plurality of redundant write generators, each coupled to a corresponding one of said write means and to said comparator means, for receiving said DC logic signal and providing a control signal to deselect a defective column to prevent data from being written onto the defective column when the memory is in the write mode.

19. The memory of claim 15, wherein each read fuse provides a DC logic signal to a read means corresponding thereto when a fusible link in said read fuse is blown to indicate which redundant column is to replace a defective column.

20. The memory of claim 19, further comprising a plurality of redundant read generators, each coupled to a corresponding one of said read means and to said comparator means, for receiving said DC logic signal and providing a control signal to deselect a defective column to prevent data from being read from the defective column when the memory is in read the mode.

* * * * *

UNITED STATES PATENT AND TRADEMARK OFFICE
CERTIFICATE OF CORRECTION

PATENT NO. : 5,268,866
DATED : December 7, 1993
INVENTOR(S) : Taisheng Feng et al.

It is certified that error appears in the above-indentified patent and that said Letters Patent is hereby corrected as shown below:

On the title page: Item [75]

First inventor's first name, "Tiasheng" is misspelled, --Taisheng--.

Signed and Sealed this

Twenty-sixth Day of July, 1994

*Attest:*

BRUCE LEHMAN

*Attesting Officer*     *Commissioner of Patents and Trademarks*